(12) United States Patent
Lin et al.

(10) Patent No.: US 6,526,545 B1
(45) Date of Patent: Feb. 25, 2003

(54) METHOD FOR GENERATING WAFER TESTING PROGRAM

(75) Inventors: Geeng-Lih Lin, Hsinchu (TW); Shien-Wang Lo, Miao Li Hsien (TW)

(73) Assignee: Vanguard International Semiconductor Corporation (TW)

( * ) Notice: Subject to any disclaimer, the term of this patent is extended or adjusted under 35 U.S.C. 154(b) by 136 days.

(21) Appl. No.: 09/633,204

(22) Filed: Aug. 7, 2000

(51) Int. Cl.$^7$ ................................................ G06F 17/50
(52) U.S. Cl. ...................... 716/4; 716/1; 716/5; 716/11; 716/20; 702/121; 700/113
(58) Field of Search .................... 702/121; 700/113; 716/1–21; 326/38, 39; 327/99; 714/724

(56) References Cited

U.S. PATENT DOCUMENTS

| | | | | |
|---|---|---|---|---|
| 5,148,379 A | * | 9/1992 | Konno et al. ................. | 716/20 |
| 5,668,745 A | * | 9/1997 | Day ............................. | 702/121 |
| 6,075,930 A | * | 6/2000 | Yamane et al. ................ | 716/1 |
| 6,314,332 B1 | * | 11/2001 | Kida ............................ | 700/113 |

* cited by examiner

*Primary Examiner*—Vuthe Siek
*Assistant Examiner*—Helen B Rossoshek
(74) *Attorney, Agent, or Firm*—Powell Goldstein Frazer & Murphy LLP

(57) ABSTRACT

A method for generating a semiconductor test program is disclosed. The method is practiced by first creating a test plan according to a test key database, then take out the related parameters from the other databases in light of the test item in the test plan and creating a semiconductor test program. The semiconductor test program is attached to the wafer acceptance test (WAT) main program as a subprogram. The method for generating the auto-testing program can promote the efficiency for writing a test program and is easy to expand and maintain according to the progress of semiconductor processes.

17 Claims, 4 Drawing Sheets

METHOD FOR GENERATING WAFER TESTING PROGRAM

FIELD OF THE INVENTION

The present invention relates to a method for testing a semiconductor wafer, and particularly to a method for generating a test sub-program to test a semiconductor wafer automatically.

BACKGROUND OF THE INVENTION

Electrical testing in the wafer level is becoming more and more important during the complicated semiconductor circuit processing. For example, the cost for semiconductor post-processes such as package and testing are becoming higher. Accordingly, it is best to reflect the real situation and eliminate abnormal wafers during the wafer level electrical testing to save money. Moreover, the cycle time of the semiconductor processes is longer nowadays, and the wafer level electrical testing can also reflect the quality of on-processing wafers to minimize the wasting of time. Besides, the wafer level electrical testing procedures can be used to monitor and detect the correlation of complicated semiconductor processes. In other words, the importance of the wafer level electrical testing includes the yield rate monitoring, extraction of the processing parameters and tools for process development.

Nevertheless, during the hundreds of (maybe thousands of) processing steps in the semiconductor production lines, the in process testing (or the semiconductor's parameter testing) is one of the major concerns of a semiconductor factory to evaluate the process capability and productivity. The process tests include items such as the isolation test, the junction leakage test or resistance measurement (such as contact resistance or sheet resistance), the device test items such as the threshold voltage measurement of a complementary metal oxide semiconductor (CMOS) integrated circuits, the saturated drain current $1_{dsat}$ of a CMOS, or the mobility of the electrons in a device . . . etc. All of the described test items are included in the wafer acceptance test (WAT) to evaluate the processes and devices respectively.

During the development of a new semiconductor technology, the developer should design a lot of electrical testing procedures to ensure the reliability and quality of the processes or devices. For example, the developer will produce a lot of test key patterns according to this new semiconductor technology or product design in order to acquire the parameters of processes or devices. It is also possible for a developing process to design a new photo-mask for test key patterns and evaluate the processes before mass production. When conducting the electrical function tests of the integrated circuits, for example, to check all the designed specifications of the CMOS device, the developer should develop automatic testing programs according to the characteristics of the parameters of processes and devices. However, the testing program of the test items and test quantities is changed due to the different requirements. Therefore, the programmer should spend a lot of effort and time to rewrite the programs even if they deal with the same test items or test plan.

For this reason, it is a waste of time and not efficient to develop many similar programs just because of the variety of testing requirements. Furthermore, there is a need in the fast developing semiconductor technology for a testing field in order to achieve a better management of the programs, better quality control and for cost savings.

SUMMARY OF THE INVENTION

The present invention responds to the need for a parameter testing program for distinct semiconductor processes and devices during the wafer level parameter testing, specifically in the development of a new semiconductor technology. Time spent for rewriting the programs and management of all the testing programs have perplexed the programmer. Therefore, the main object of the present invention is to develop a method for generating a wafer level parameter testing program automatically.

Another object of the present invention is to use the method for generating the wafer level parameter testing program to fit the requirement of the future expansion for different technologies of the semiconductor industry.

Still another object of the present invention is to use the method for generating the wafer level parameter testing program to make an efficient maintenance and management of the testing field.

According to the above objects, the summary of the present invention is as follows:

Firstly, a test key database describing the test items and locations of the test patterns have to be completed by a developer, wherein the format and title of the database is related to the process parameter database, device type database, and device parameter database. Subsequently, the user selects the test items according to the test key database and creates a test plan, then inputs to the controlling program (herein referred to as auto program generator, APG). The APG program will check the data format of the test plan and display an error message when the format is not correct. The APG program will take out the test items one by one if the input data format is correct.

Thereafter, the APG program will find out the test condition parameters according to the processes and devices, such as the data from the test sub-program database, or from the process parameter database when it belongs to the process test items and/or from the device parameter database when it belongs to the device test items. After all the test condition parameters of test items in the test plan are collected, the APG program will create a optimized test program. The "optimized" test program is sorted according to the efficiency or for the purpose of test protection, such as the minimum movement of the probe or the lower voltage tested in advance. Afterward, the main WAT (wafer acceptance test) program uses this test program as a sub-program and proceeds the testing to evaluate the processes and devices.

By using the APG program to generate the test programs automatically, the new technology's developer does not have to rewrite the test program but only has to maintain the input tables (i.e., databases) of the APG program. In addition, the optimized creating flow path of the APG program can provide the best quality for testing and reduce the human error. Besides, the expandable databases can also be used in future generations.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for generating a parameter test program of a semiconductor wafer automatically. Due to the requirement of multi-testing programs in the developing of the semiconductor processes, the program creating procedures in the prior art are always routine jobs for the programmers and hence is wasting manpower and not efficient. Therefore, the present invention develops an auto program generator (APG) engine to produce the test programs and the related files concerning about the quality issue automatically. A description will now be given of the preferred embodiment of the present invention with reference to the accompanying drawings and tables.

Figure 1:
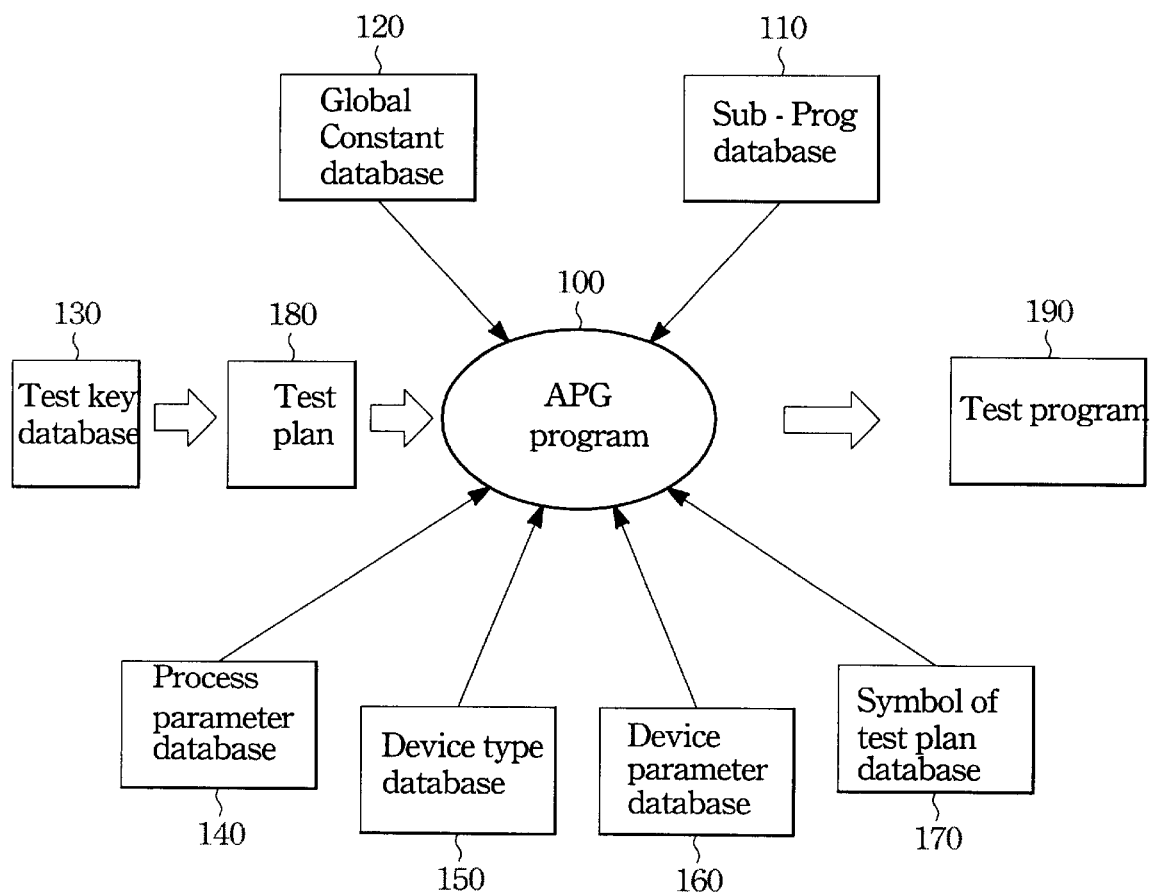
FIG. 1 is a schematic diagram of an auto program generator engine according to one embodiment of the present invention.

Referring to FIG. 1, the figure shows the auto program generator (APG) engine created in accordance with the present invention. In this schematic. drawing, the central circle is called the auto program generator (APG) 100, which means that it is a specific transformer or actuator such as a coded programming language to promote the input databases configured into useful materials or outputs. There are seven databases around the APG program and capable of feeding into the APG program in this figure. That is, the test sub-program database 110, the global constant database 120, the test key database 130, the process parameter database 140, the device type database 150, the device parameter database 160, and the symbol for test plan database 170, respectively.

The main inputting database is the test key database 130. Typically, a semiconductor process will use specific test patterns for a wafer level parameter testing. These test patterns are known as test keys. The present invention will firstly record the test items, test pins, and parameters of the test patterns into test key database 130 and then the user can make a correct test. Furthermore, test sub-program database 110 records the provided test methods and conditions that will attach to the wafer acceptance test (WAT) main program as a test sub-program. The global constant database 120 includes constant value that can be referenced by the entire program. The process parameter database 140 is related to the parameters of the test condition for all the process test items. The device type database 150 is the classification of processed semiconductor devices and the corresponding parameters. Subsequently, the device parameter database 160 is related to the different test parameters and the corresponding test condition. Finally, the symbol for test plan database 170 defines the symbols in the test key database 130 in order to create the program code.

The user may choose the test items from the test key database 130 to create the test plan 180 and then input to the APG program 100. APG program 100 will check the data format of the test plan 180 and display an error message if the format is not correct. When the data format is correct, APG program 100 will take out the test items from the test plan 180 one by one. Afterward, the APG program 100 will find out the other test parameters from the rest databases according to the device type or process type testing and create test program 190. The test program 190 is the object code created by the APG program 100 and may be used by the WAT main program.

Figure 2:
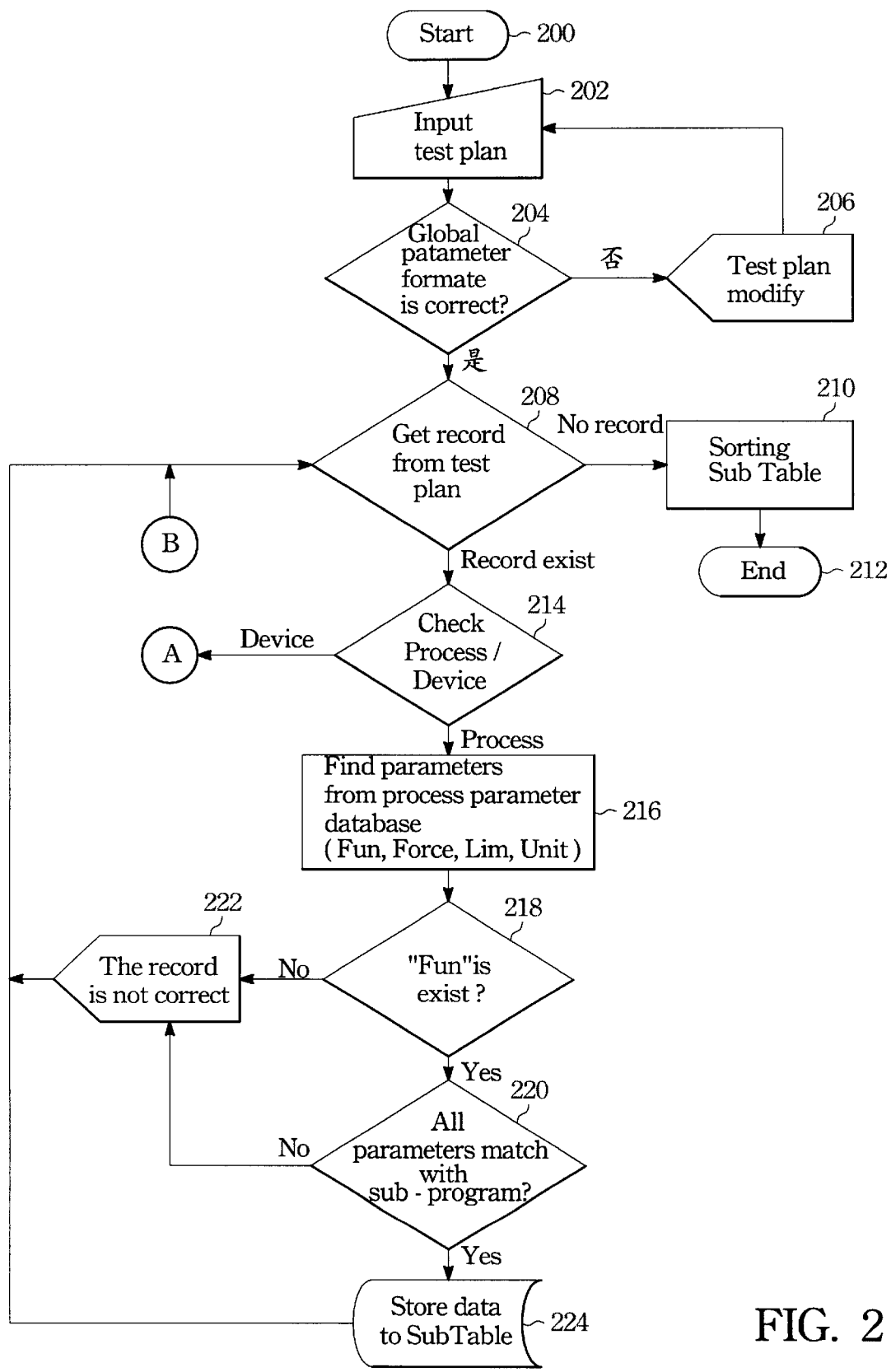
FIG. 2 is a process flow for process parameters of the auto program generator engine according to one embodiment of the present invention.
Figure 3:
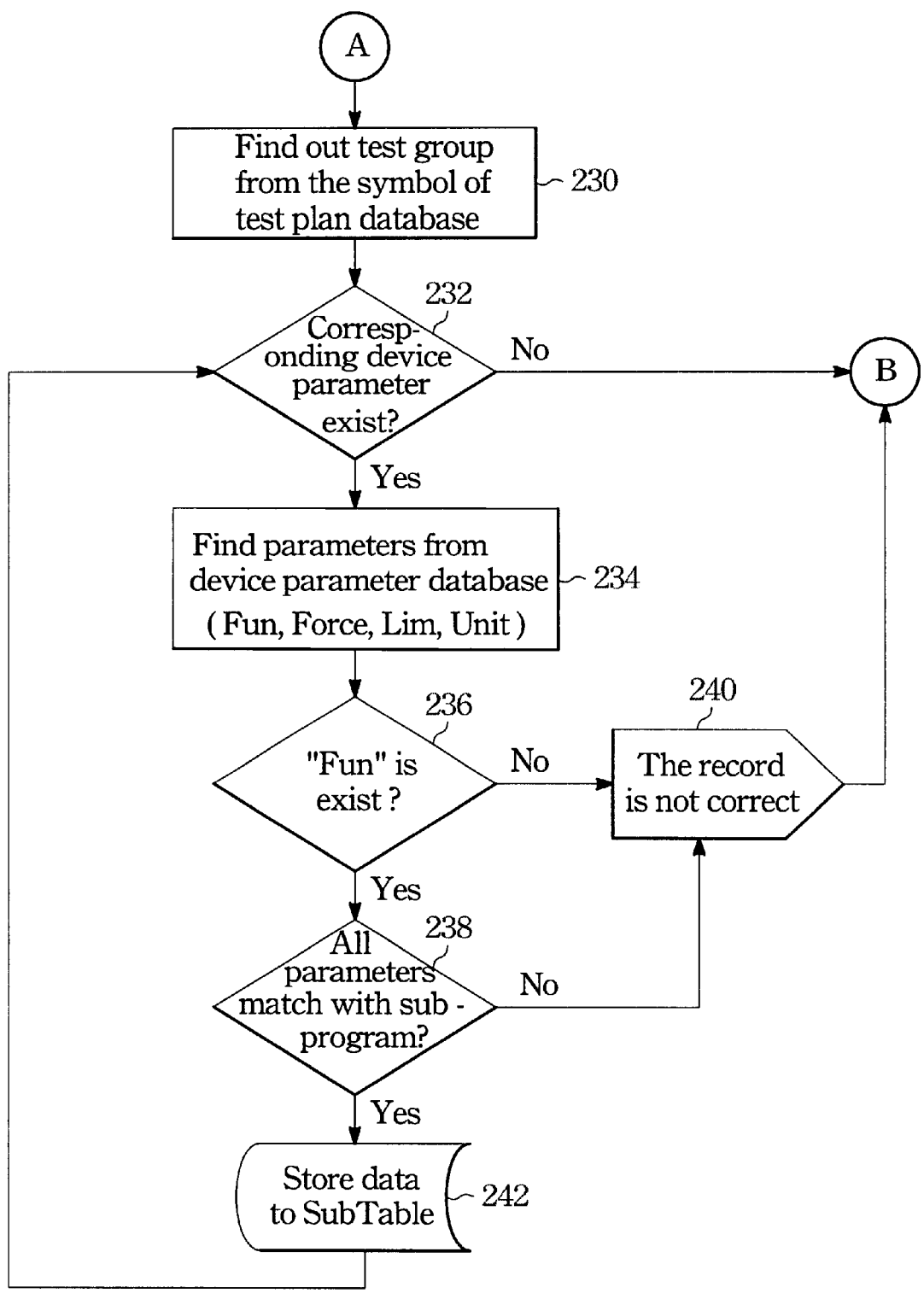
FIG. 3 is a device flow for device parameters of the auto program generator engine according to one embodiment of the present invention.

Now referring to FIGS. 2 and 3, the figures disclose a process flow and a device flow to generate the auto-test programs according to the present invention. After starting point 200 of the chart, the user should input the related values of the test items according to the process parameter database 140, the device type database 150 and the device parameter database 160 to construct the test key database 130. Afterwards, the first step to create the resulting program is to produce the test plan 180 from the test key database 130 (step 202).

The APG program 100 will check the global parameter of the test plan 180 at the beginning (step 204) and will go to step 206 to modify the test plan if the parameter format is not correct, then go back to step 202 for a new test plan. If the format of global parameter is correct, the APG program 100 will take out the test items from test plan one by one (step 208). The test plan 100 is as follows:

TABLE 1

Test Plan

| Additional | Item | Description | TG | Pin | Type | Norm |
|---|---|---|---|---|---|---|
| Vt1 | CLD_0.2/0.2 | | L07 | 14,15,2,1 | N | |
| Vt2 | CLD_0.2/0.22 | | L05 | 6,2,7,17 | N | |
| V | Dw_PI | Dense.305 | L01 | 15,16 | | 0.305, 71.395 |
| V | Chn_C3/P+ | WoP1 | L07 | 3,4,10 | P | 222_ea |

Wherein:

"Additional" is designed for the optional column, "V" in this column represents the test item is marked and empty content represents ignored this test item. Vt1 and Vt2 are specific testing parameter and defined in the process parameter database;

"Item" is the test items of the device or process;

"Description" is an auxiliary description of test items;

"TG" is the test group, which represents the corresponding test patterns of the test items in test key;

"Pin" is the pin assignment of the test items;

"Type" is the polarization of the test voltage;

"Norm" is the parameter that calculated after testing.

Every record in this table has different test key data according to different test items. The left side of the underline within the "Item" column represents a device related parameter if it is defined in the device type database; or it represents a process related parameter such as an electrical parameter. If it is a device related parameter, the right side of the underline represents the gate length (L) and width (W) of the device and is separated by a "/"; otherwise it is a process related parameter and right side of the underline represents a process module.

Furthermore, the global constant database described above is as follows:

TABLE 2

Global Parameter

| Name | Value | Type | Command |
|---|---|---|---|
| Product Name | VIS9999 | String | |
| Program Name Head | P | String | |
| Vext | 3.3 | Real | External power |
| Vint | 2.5 | Real | Internal power |
| Vbx | −1 | Real | Substrate bias |
| Tox_peri | 100 | Real | Tox for periphery circuit |
| Tox_peri | 50 | Real | Tox for cell array circuit |
| Tt | −1 | Real | Type |
| . . . | | | |

Wherein above table defines the parameters of all the databases.

After the format of the global parameter is confirmed (step 204), the step 208 takes out the test items from the test plan 180 one by one. Thereafter, APG program 100 will reference the content of related databases according to the test plan 180 (i.e. step 214~220, more detail will be described later) and create the corresponding test codes. The test codes will be stored in the sub-table (step 224) and sorted by considering the test efficiency when there is out of test item. Combination of all the sorted test codes consist of final program code (step 212).

It is noted that the APG program 100 will standardize the final program code in order to fit the test requirement. In the present invention, the definition of the standard program code is as follows:

Fun$(TL$, Pin$, Force$, Lim$, Return$, Norm$)
Wherein:
  Fun$ is the name of test sub-program;
  Pin$ is the test group number of test patterns;
  Force$ is the power source condition for testing;
  Lim$ is the restriction for testing;
  Return$ is the parameter of test result;
  Norm$ is the parameter needed for test result calculation.

For example, the test code I2t1 (5, 1, 2, 5, 0.1, Rr(8), 1000) represents the test group is 5, the test patterns with test pin 1, 2, 5 use the test code I2t1 (test sub-program). Furthermore, the calculated parameter is 1000 and the result is stored in data array Rr(8).

In step 210, the sub-table sorts the collected test codes according to the test efficiency (e.g. calculate the minimum movement of the test probe to decide the test sequence of the test group) and the protection concern (e.g., non-destructive test prior to destructive test). The design of the sub-table can enhance the function for sorting and therefore the test quality of the program.

The data processing flow between step 214 and step 220 creates the test codes according to each item in the test plan 180. As described previously, the WAT program may include process tests such as the isolation test, the junction leakage test or resistance measurement . . . etc., or the device tests such as threshold voltage measurement, the saturated drain current $I_{dsat}$, or the mobility of electron . . . etc., all the test patterns of test items are defined in the test key database 130.

If the test items belong to the device test, then the flow will go to mark A for subsequent steps, otherwise the flow goes to step 216 and find out the related parameters from the process parameter database 140. The database is arranged such as:

TABLE 3

Process Parameter

| ItemA | ItemB | Fun | Force | Lim | Unit2 |
|---|---|---|---|---|---|
| OvI | * | V3t1 | 1E-6,0 | 10 | A |
| Lk | * | I2t1 | 5 | 0.1 | A |
| Dw | * | L3t1 | Tt*Vint,0,Pass | 0.1 | Um |
| Chn | P1 | L3t1 | Tt*Vh,0,pass | 0.1 | Um |
| Rs | M1,M2 | R3t1 | Tt*Vint,0 | 0.1 | Ohm/ea |

Wherein:

"ItemA" represents the name of parameter and "ItemB" represents the module of process, "*" in "ItemB" stands for unlimited items. Besides, "ItemA" and "ItemB" correspond to column "Item" in Table 1;

"Fun" represents the corresponding sub-program related to this test item;

"Force" is the main testing value;

"Lim" is the limited parameter of the test item, wherein "Fun",

"Force" and "Lim" are related to each other;

"Unit2" is the measured unit in this test item.

After the related parameters such as "Fun", "Force", "Lim", "Unit" are found in step 216, the APG program 100 will check the sub-program in the column "Fun" exist or not (step 218). If the sub-program does not exist, then the flow goes to step 222 displaying an error message and show that there is an input error or the sub-program is not defined. Afterwards, the flow goes back to step 208 to get another record. If the sub-program does exist, then step 220 will check the "Force", "Lim", "Pin", and "Norm" value to find out if they match with the parameters in the sub-program. Subsequently, if the step 220 is false, then the flow goes to step 222 to display an error message and then goes back to step 208 as described before. Finally, if the step 220 is true, then the data is stored in the sub-table and a test program is generated (step 224). After that, the flow goes back to step 208 for another record. In this figure, mark A is connected to the flow of device testing and mark B represents the end or error of the device testing flow. From the above description, when single record of the input databases create the corresponding test program or the data is not correct, the flow will go back to step 208 for another record. The test sub-program database 110 as described above is as follows:

TABLE 4 test sub-program database

| Fun | PinCount | ForceCount | LimCount | OutCount | NorCount | Unit1 |
|---|---|---|---|---|---|---|
| Gmmax1 | 4 | 5 | 1 | 6 | * | * |
| R3t1 | 3 | 2 | 1 | 1 | 1 | Ohm |
| V3t1 | 3 | 2 | 1 | 1 | 1 | V |
| V4t1 | 4 | 2 | 1 | 1 | 1 | A |

Wherein:

"Fun" represents the name of test sub-program;

"XxxxCount" represents the number of parameters of test sub-program;

"Unit1" is the measured unit in this test item.

Now referring to FIG. 3, the flow goes to mark A in FIG. 2 when the test item belongs to a device. Since the input data is a device test item, the APG program 100 will get the related parameters from device type database 150 as follows:

TABLE 5

Device Type database

| ItemA | ItemCx | Vop | Vbx | Tox |
|---|---|---|---|---|
| ND | PeriD | Tt*Vext | 0 | Tox_peri |
| PD | PeriD | Tt*Vext | 0 | Tox_peri |
| CLD | CellD | Tt*Vint | Vbb | Tox_cell |
| SD | CellD | Tt*Vint | Vbb | Tox_cell |

Wherein:

"ItemA" represents the name of device type and corresponds to column "Item" in Table 1;

"ItemCx" represents the group of device type;

"Vop" represents the operational voltage of the device;

"Vbx" represents the bias voltage of substrate of the device;

"Tox" is the thickness of oxide of the device.

After the parameters of the device testing is acquired from Table 5, APG program 100 will reference the following symbol of test plan database 170 such as:

TABLE 6

Symbol of Test Plan database

| ItemC | ItemCx | TestItem |
|---|---|---|
| V | PeriD | 1,13,15 |
| V | CellD | 1,12,15 |
| All | PeriD | 1,2,3,10,11,13,15,16,18 |
| All | CellD | 1,2,3,4,5,6,7,8,9,10,11,12 |

In this table, the sign "V" in column "ItemC" represents general option for process parameter or device parameter. In the device parameter, "ItemC" corresponds to column "Additional" in Table 1. "ItemCx" corresponds to "ItemCx" in table 5 and stands for the group of device type, "TestItem" corresponds to the following column "Dev_No" of the device parameter database 160 (Table 7) and stands for the test device parameters of the specific variable (ItemC) input to the test plan 180 for certain test group (ItemCx). This kind of design provides multiple test sub-programs and parameters in one test pattern.

In step 230 of FIG. 3, the APG program 100 will find out the device type and device type group in the columns of "Additional" and "Item" from Table 1, then check the test parameter group of this device in "TestItem", and then check the corresponding device parameter exist or not (step 232). If the result is false, the flow goes to mark B and back to the step 208 in FIG. 2 to get another record, otherwise the flow goes to step 234 and find out the test parameters from the device parameter database 160 such as follows:

TABLE 7

Device Parameter database

| Dev_No | ItemB | Fun | Force | Lim | Unit2 |
|---|---|---|---|---|---|
| 1 | Vt1(Lo Vd) | Gmmax1_1 | Tt*Vop,0,Tt*Vop, 0.02,Vbx | 0.1 | V |
| 2 | Vt2(Hi Vd) | Gmmax1_2 | Tt*Vop,0,Tt*Vop, 0.02,Vbx | 0.1 | V |
| 3 | Gmmax | Gmmax1_3 | Tt*Vop,0,Tt*Vop, 0.02,Vbx | 0.1 | V |
| 4 | Ith0 | Gmmax1_6 | Tt*Vop,0,Tt*Vop, 0.02,Vbx | 0.1 | A |

Wherein:

"ItemB" is the name of the device parameter;

"Fun" represents the subprogram related to this device test, left side of underline is the name of the test sub-program, right side of underline is the specific parameter of the test sub-program;

"Force" is the main testing value such as voltage or current;

"Lim" is the limited parameter of the test item to protect the test device, wherein "Fun", "Force" and "Lim" are related to each other;

"Unit2" is the measured unit in this test item.

After the parameters such as "Fun", "Force", "Lim", "Unit" are found in step 234, the APG program 100 will check the test sub-program in "Fun" exist or not (step 236). If the sub-program does not exist, then the flow goes to step 240 and display an error message shows that the test sub-program is not defined or the input is wrong. Afterwards, the flow goes to mark B and get another record as described before. If the sub-program does exist, then the step 238 will check the "Fun", "Lim", and "Pin" values to find out if they match with the parameters defined in the sub-program. Subsequently, if the step 238 is false, then the flow goes to step 240 to display an error message. Finally, if the step 238 is true, then the data is stored to the sub-table and generate the test program of the device (step 242). Afterwards, the flow goes back to the test group of step 232 for the next item. From the above description, the corresponding test program of every test item in the test group is created for the device test, or the flow will also goes to step 232 for a next record when the data format is not correct.

Figure 4:
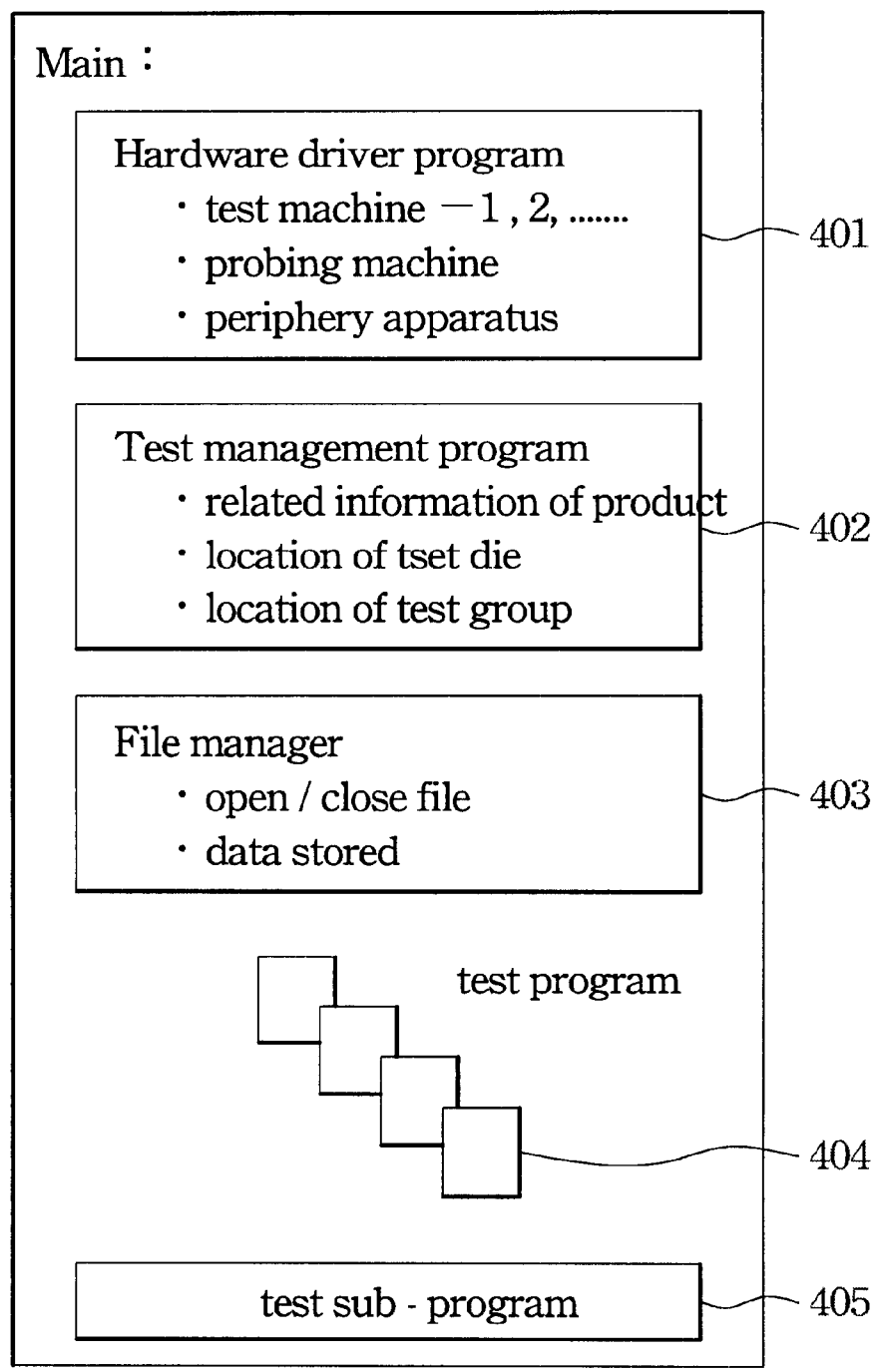
FIG. 4 is a schematic diagram of the WAT program structure in accordance with the present invention.

Referring to FIG. 4, the figure shows the structure of the WAT test program, wherein the WAT test program further includes hardware driver program 401, management program 402, file management program 403, test program 404 and test sub-program 405. There are more than one test programs 404 according to different test items. Therefore, there are more than one test programs in a product or test key. The APG program of the present invention is creating the corresponding test program under the variety of requirements. The management program 402 is the flow control program out of the test program 404, such as choose the test program, change wafer, change die, change test group, open file, store the data, and close file, also include the setting of parameters. The test sub-program 405 relates to the corresponding test program of each test item. Furthermore, the hardware driver program 401 can drive the related hardware of the WAT testing system (e.g. HP 4062), such as the test machine (e.g. HP 4140, HP 4284), the probing machine and periphery apparatus (e.g., hard disc).

By way of the function of APG program of the present invention, the user can easily expand the parameters in the described process parameter database or device parameter database to satisfy the future needs of new technology development. Furthermore, the management of created program also becomes easier.

As is understood by a person killed in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method for generating a semiconductor test program, said method comprising:

constructing a first database, a second database, and a third database by inputting semiconductor test items and parameters;

constructing a test key database, wherein said test key database includes said semiconductor test items;

creating a test plan, wherein said test plan is derived from said test key database;

checking validity of data in said test plan, wherein a fourth database is referenced;

taking out said semiconductor test item from said test plan; and creating said semiconductor test program, wherein said semiconductor test program is a sub-program of a wafer acceptance test (WAT) main program.

2. The method of claim 1, wherein said step of take out said semiconductor test item from said test plan further comprises:

checking said semiconductor test item belongs to a process test or a device test, and acquiring said parameters from said first database or acquiring said parameters from said second database with said process test or said device test respectively;

checking a fifth database if said fifth database exists a corresponding data of said semiconductor test item;

saving said semiconductor test item into a subtable and sorting said subtable according test efficiency and requirement.

3. The method of claim 2, wherein said step of check said fifth database further comprises taking out another semiconductor test item if said fifth database does not exist said corresponding data of said semiconductor test item.

4. The method of claim 1, wherein said first database is a process parameter database.

5. The method of claim 1, wherein said second database is a device parameter database.

6. The method of claim 1, wherein said third database is a device type database.

7. The method of claim 1, wherein said fourth database is a global constant parameter database, which includes constant values that can be referenced by said semiconductor test program.

8. The method of claim 1, wherein said fifth database is a test sub-program database, which includes test methods and constraints.

9. The method of claim 1, wherein a plurality of said semiconductor test programs are created in one single product or one test key according to different said semiconductor test items.

10. A method for generating a semiconductor test program, said method comprising:

constructing a first database, a second database, and a third database by inputting semiconductor test items and parameters;

constructing a test key database, wherein said test key database includes said semiconductor test items;

creating a test plan, wherein said test plan is derived from said test key database;

checking validity of data in said test plan, wherein a fourth database is referenced;

taking out said semiconductor test item from said test plan;

checking said semiconductor test item belongs to a process test or a device test, and acquiring said parameters from said first database or acquiring said parameters from said second database with said process test or said device test respectively;

checking a fifth database if said fifth database exists a corresponding data of said semiconductor test item;

saving said semiconductor test item into a subtable and sorting said subtable according test efficiency and requirement; and creating said semiconductor test program, wherein said semiconductor test program is a sub-program of a wafer acceptance test (WAT) main program.

11. The method of claim 10, wherein said first database is a process parameter database.

12. The method of claim 10, wherein said second database is a device parameter database.

13. The method of claim 10, wherein said third database is a device type database.

14. The method of claim 10, wherein said fourth database is a global constant database, which includes constant values that can be referenced by said semiconductor test program.

15. The method of claim 10, wherein said fifth database is a test sub-program database, which includes test methods and constraints.

16. The method of claim 10, wherein said step of check validity of data in said test plan further comprises rebuilding said test plan if the format of said data is not correct.

17. The method of claim 10, wherein a plurality of said semiconductor test programs are created in one single product or one test key according to different said semiconductor test items.

* * * * *